(12) United States Patent
Kuriyama

(10) Patent No.: US 6,549,076 B2
(45) Date of Patent: Apr. 15, 2003

(54) HIGH-OUTPUT AMPLIFIER

(75) Inventor: Yasuhiko Kuriyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/961,111

(22) Filed: Sep. 24, 2001

(65) Prior Publication Data
US 2002/0036543 A1 Mar. 28, 2002

(30) Foreign Application Priority Data
Sep. 25, 2000 (JP) ........................................ 2000-290801

(51) Int. Cl.[7] ................................................ H03F 3/19
(52) U.S. Cl. ....................... 330/296; 330/302; 330/303; 327/560
(58) Field of Search ................................ 330/289, 295, 330/296, 302, 303, 307; 327/560, 561, 52

(56) References Cited

U.S. PATENT DOCUMENTS

| 5,625,205 A | * | 4/1997 | Kusama | 257/197 |
| 5,629,648 A | | 5/1997 | Pratt | 330/289 |
| 6,121,841 A | * | 9/2000 | Sakuno | 330/285 |
| 6,300,837 B1 | * | 10/2001 | Sowlatti et al. | 330/296 |
| 6,313,705 B1 | * | 11/2001 | Dening et al. | 330/276 |

OTHER PUBLICATIONS

K. Murayama, et al., Proceedings of the 2000 ICICE General Conference, C–10–7, p. 65, "Thermally Stable Power HBT by the Bias Circuit Using Schottky Diode", 2000.

* cited by examiner

Primary Examiner—Timothy P. Callahan
Assistant Examiner—An T. Luu
(74) Attorney, Agent, or Firm—Oblon, Spivak, McClelland, Maier & Neustadt, P.C.

(57) ABSTRACT

A high-output amplifier (1), having a high gain, (2) having a high efficiency, (3) less affected by temperature changes, (4) operative linearly in output levels over a wide dynamic range and (5) using a control voltage, comprises a transistor amplifier, and a bias circuit having first and second bias circuits. A first transistor provided in the first bias circuit has a first terminal and a control terminal that are short-circuited and connected to a control source as a first high-voltage-side source and to a control circuit of the transistor amplifier, and a second terminal connected to a low-voltage-side source. A second transistor provided in the second bias circuit has a control terminal connected to the control source, a first terminal connected to the second high-voltage-side source, and a second terminal connected to the control terminal of the transistor amplifier.

16 Claims, 12 Drawing Sheets

BIAS CIRCUIT OF LATTER-STAGE TRANSISTOR

BIAS CIRCUIT OF LATTER-STAGE TRANSISTOR

HIGH-OUTPUT AMPLIFIER

CROSS-REFERENCE TO RELATED APPLICATIONS

This application is based upon and claims the benefit of priority from the prior Japanese Patent Application No. 2000-290801, filed on Sep. 25, 2000, the entire contents of which are incorporated herein by reference.

1. Field of the Invention

This invention relates to a high-output amplifier using a transistor amplifier.

2. Background of the Invention

In the field of wireless communication systems, digital communication such as CDMA (code division multiple access) is currently the major system, there is a demand for a high-output amplifier (1) having a high gain, (2) having a high efficiency, (3) less influenced by temperature changes, and (4) linearly operative in output levels of a wide dynamic range. In addition to those, in systems like portable telephones using low source voltages, such a high-output amplifier is additionally required to be (5) operative with a low control voltage.

As a conventional high-output amplifier, there is a method using an emitter-grounded bipolar transistor for class AB operation to supply a bias current/voltage by means of a base bias circuit. The principle and characteristics of this method are explained below.

To obtain a high-output amplifier with a high gain, an emitter-grounded bipolar transistor is used as the transistor amplifier of the high-output amplifier. The high-output amplifier is made up of a control circuit and the transistor amplifier, and a bipolar transistor is typically used as the transistor amplifier. For connection of the bipolar transistor, although there are emitter-grounded circuits, base-grounded circuits, collector-grounded circuits (emitter follower circuits), and so on, because of a high gain, emitter-grounded circuits are used in an overwhelmingly majority of amplifier circuits. Emitter-grounded circuits are configured to use the emitter as a common terminal for both the input and the output, apply an input signal to the base and extract the output from the collector.

In order to obtain a high-efficiency high-output amplifier, the bias condition of the above-mentioned emitter-grounded transistor amplifier is adjusted for class AB to perform class AB operation. That is, a high-efficiency amplifier will be obtained by adjusting the bias condition for class B (in which power consumption is essentially zero when the input is zero) instead of class A (in which a considerable amount of current is always supplied to the transistor). Actually, however, since class B operation will increase the distortion by fluctuation of the gain because of the non-linearity of the mutual conductance of devices, by a way of use as class AB (in which a small d.c. current=idling current flows into the transistor even when the input is zero), a high-efficiency high-output amplifier can be obtained.

Next, for the purpose of obtaining a high-output amplifier less affected by temperature fluctuation, a bias is supplied to the control terminal (base) of the transistor amplifier through a bias circuit. That is, in high-output amplifiers using bipolar transistors, major circuits are those using the base/emitter voltage as the reference. However, temperature coefficient of the output current is fairly large, a base bias circuit is used as one of control circuits to prevent the base voltage/current from largely changing with temperature. Such high-output amplifiers include a first conventional high-output amplifier using a bias circuit shown in FIG. 13. The bias circuit of FIG. 13 includes a bipolar transistor Q1 and a resistor R1, and uses a diode-connection current mirror circuit made by short-circuiting the base and the collector to supply a bias voltage and a bias current Ib.

As reviewed above, by using a class AB emitter-grounded bipolar transistor, a high-output amplifier having (1) a high gain and (2) a high efficiency can be obtained, and by using the method of supplying the bias current/voltage by using the first conventional bias circuit shown in FIG. 13, a high-output amplifier (3) less affected by temperature fluctuations. Further, since the bias circuit of FIG. 13 uses a single stage transistor, (5) the control voltage may be low.

The first conventional high-output amplifier using the bias circuit of FIG. 13, however, cannot satisfies the requirement of (5) linear operation in output levels over a wide dynamic range. That is, in emitter-grounded bipolar transistor for class AB operation, since the average collector current increases in response to the output level, the bias circuit has to supply a sufficient additional amount corresponding to the increase of the average base current responsively; however, the bias circuit as shown in FIG. 13 cannot supply a sufficient amount of current because a voltage drop by the resistor R1 occurs.

A second conventional high-output amplifier using a bias circuit of FIG. 14 linearly operates in output levels over a wide dynamic range. The circuit of FIG. 14 is a current mirror circuit that supplies the base current through the emitter follower, etc., in which Q is a bipolar transistor, R is a resistor, Vcc is the source voltage, and a current can be supplied by decreasing the output impedance.

The second conventional high-output amplifier using the bias circuit of FIG. 14, however, involves the problem that (5) the control voltage of the bias circuit inevitably increases. That is, in the bias circuit of FIG. 14, using two-stage transistors, the bias current Ib fluctuates largely with temperature unless the control voltage $V_{cont}$ is much higher than twice as large as the ON voltage of the transistors. For example, in the circuit of FIG. 14, let the operation voltage of the bipolar transistor Q be 1.2V, then the control voltage $V_{cont}$ must be much higher than 2.4V. So, if a control voltage around 2.7V is used for operation, the bias current will be seriously affected by temperature changes. If, however, the control voltage is raised, it invites a serious problem in systems like portable telephones that use low source voltages.

As discussed above, with conventional emitter-grounded transistor amplifiers biased for class AB, although it has been possible to obtain a high-output amplifier having (1) a high gain and (2) a high efficiency, but because of insufficient characteristics of base bias circuits of transistor amplifiers, it has been difficult to obtain a high-output amplifier (3) less affected by temperature changes, (4) linearly operative in output levels over a wide dynamic range and (5) controllable with a low control voltage.

BRIEF SUMMARY OF THE INVENTION

According to an embodiment of the invention, there is provided a high-output amplifier comprising:

a bias circuit (BC) having a first bias circuit and a second bias circuit, said first bias circuit including a first transistor (Q1) having one end connected to a first high-voltage-side source (Vcont) and the other end connected to a low-voltage-side source (Vss), said one end being connected to the control terminal of the first transistor, said second bias circuit including a second transistor (Q2) having one end connected to a second high-voltage-side source (Vcc), the other end connected to said one end of said first transistor (Q1), and a control terminal connected to said first high-voltage-side source (Vcont); and a transistor amplifier (RF1) having a control terminal connected to said one end of said first transistor (Q1), one end as an output terminal of said high-output amplifier, and the other end connected to a low-voltage-side source.

DETAILED DESCRIPTION OF THE INVENTION

Preferred embodiments of the invention will now be described below with reference to the drawings.

Taken as the first to fourth embodiments are examples each using compound bipolar transistors (InGaP/GaAs HBT) with an emitter of InGaP and a base of GaAs as transistors of a bias circuit and a transistor amplifier. As the fifth embodiment, here is taken an example using FET as a transistor of a second bias circuit in a bias circuit.

(First Embodiment)

Figure 1:
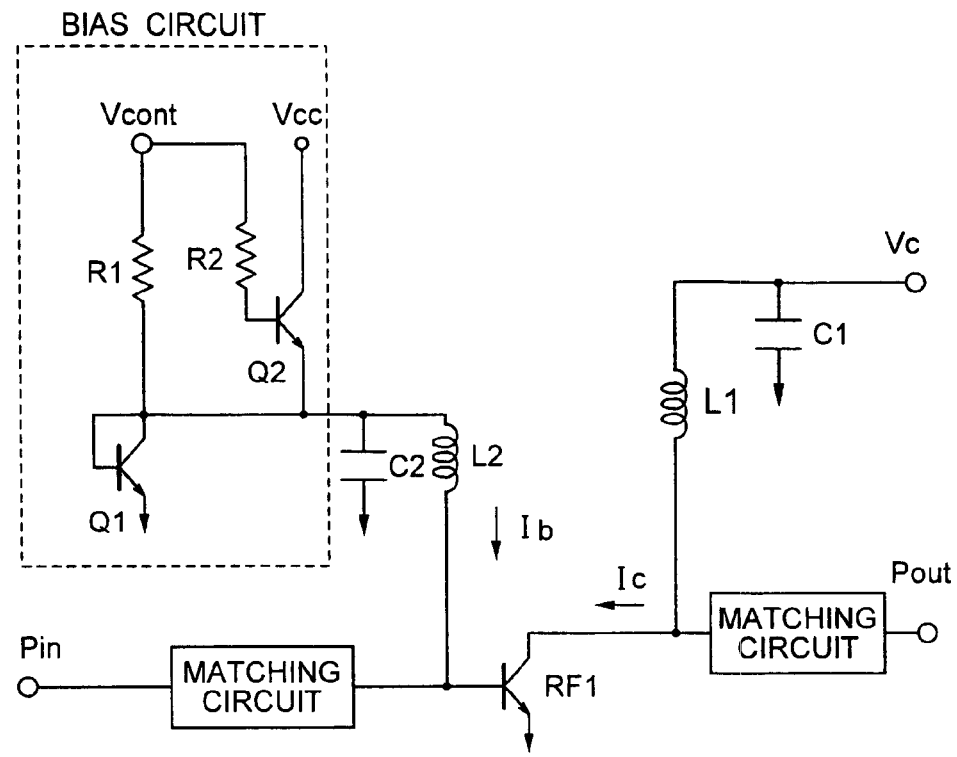
FIGS. 1 and 1A are diagrams that show different circuit arrangements of high-output amplifiers according to the first embodiment of the invention.
Figure 2:
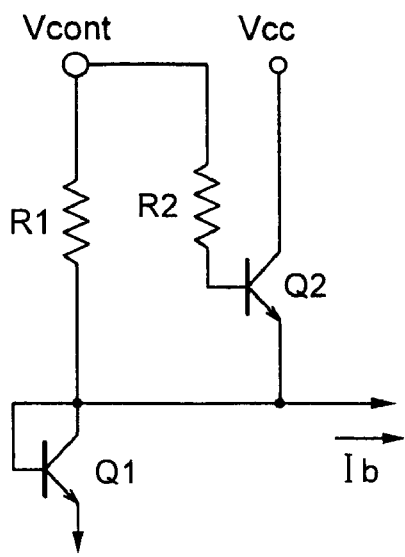
FIGS. 2 and 2A are diagrams that show different circuit arrangements of high-output amplifiers according to the first embodiment of the invention.

FIG. 1 is a diagram that shows an arrangement of a high-output amplifier according to the first embodiment of the invention. The portion encircled by a broken line in FIG. 1 is a bias circuit, and FIG. 2 shows this bias circuit. All transistors in the circuit have an InGaP/GaAs HBT structure.

Explained below are circuit arrangements, operations and characteristics of the high-output amplifier and the bias circuit of the high-output amplifier.

First explained is the circuit arrangement of the high-output amplifier with reference to FIG. 1. RF1 denotes a bipolar transistor amplifier with its emitter grounded, having a multi-emitter structure including thirty-two and the emitter size of 4×30 $\mu m^2$. A voltage Vcc=3.4V is applied to the collector of the bipolar transistor amplifier RF1 via an inductance L1. Connected to the base is the bias circuit for supplying a DC biasing base voltage through an inductance L2. Thereby, a base current is supplied from the bias circuit. For the purpose of realizing a high efficiency, the bias circuit is configured to effect class AB biasing to RF1. Pin denotes an input terminal, Pout denotes an output terminal, and C1 and C2 are capacitors.

Next explained is the arrangement of the bias circuit with reference to FIG. 2. The bias circuit includes a first bias circuit and a second bias circuit. The first bias circuit comprises a resistor R1 and a transistor Q1 whereas the second bias circuit comprises a resistor R2 and a transistor Q2. The emitter size of the transistor Q1 forming the first bias circuit is 4×20 $\mu m^2$, and the base and the collector are short-circuited to form a diode connection and thereby function as a diode. In Q1, the short-circuited base and collector are connected to a control voltage Vcont=2.2V via the resistor R1=400Ω and also to the control terminal of the transistor amplifier RF1, and the emitter is grounded. The first bias circuit cannot supply a large base current because its output impedance is high, but it is less affected by temperature changes.

The transistor Q2 of the second bias circuit has the emitter size of 4×30$\mu m^2$ and has a multi-emitter structure including eight. In Q2, the base is connected to the control voltage Vcont=2.2V via the resistor R2=200Ω, the collector is connected to the source voltage Vcc=3.4V, and the emitter is connected to the control terminal of the transistor amplifier RF1, thereby to form an emitter follower structure. The second bias circuit, having low output impedance, can supply a large base current.

The bias circuit of the high-output amplifier according to the instant embodiment combines the first bias circuit and the second bias circuit explained above to make use of their respective merits. Thereby, regardless of the control voltage as low as 2.2V, it can supply a large base current and can ensure a stable base current even upon temperature changes.

Next explained are operations of the bias circuit (FIG. 2) in the high-output amplifier according to the instant embodiment. When the base current of the transistor amplifier RF1 is zero or very small, the transistor Q1 is ON, but the transistor Q2 is OFF. As the base current of RF1 increases, the current flowing into R1 also increases by the increased amount of the base current. As a result, the base/emitter voltage of the transistor Q1 drops, the emitter voltage of the transistor Q2 drops together with the base voltage of the transistor Q1, the base/emitter voltage of the transistor Q2 increases, and Q2 turns ON. In this manner, the bias circuit in the high-output amplifier according to the instant embodiment, having two bias circuits, can supply the small base current from the first bias circuit less affected by temperature changes, and can supply the large base current from the second bias circuit.

Figure 1A:
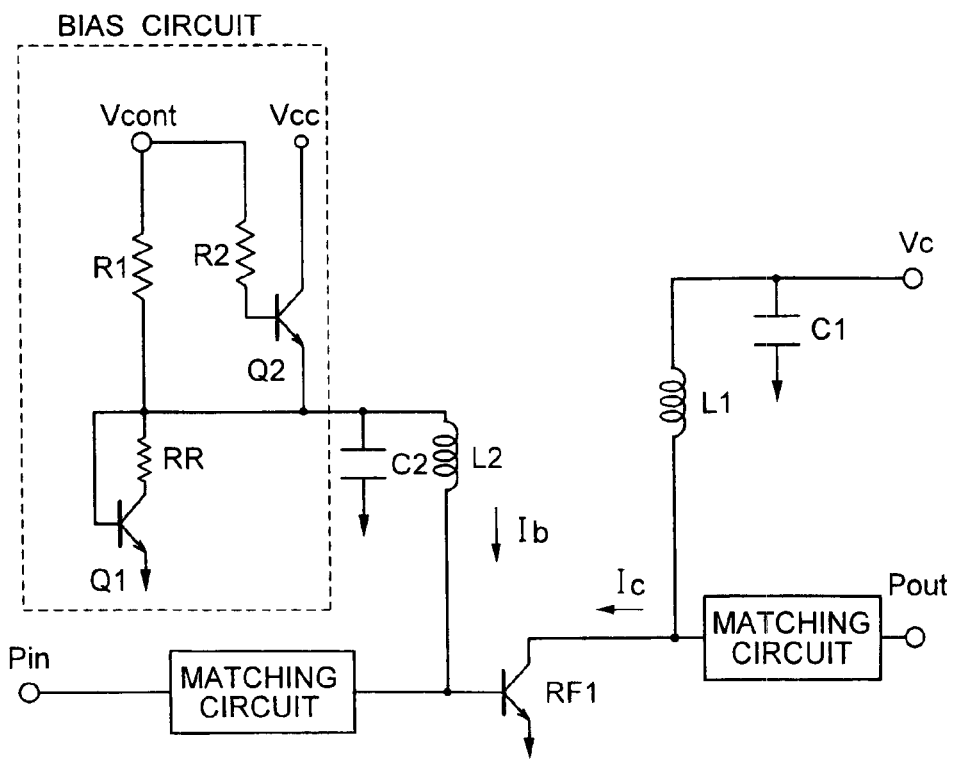
Figure 2A:
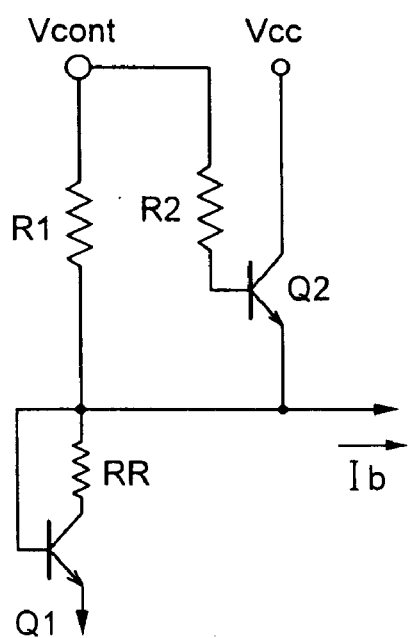

FIGS. 1A and 2A show an example connecting a resistor RR for current adjustment to the collector of the transistor Q1 and having the same structure in the other respects.

Next explained are characteristics of the high-output amplifier according to the instant embodiment, in comparison with those of a conventional circuit. The high-output amplifier used as the comparative example is the first conventional high-output amplifier using the circuit of FIG. 13 as its bias circuit. This high-output amplifier involves the problem that its linearly operating range is narrow as already discussed above. The control voltage of the bias circuit is 2.2V in both the circuit of the instant embodiment and the conventional circuit.

Figure 3:
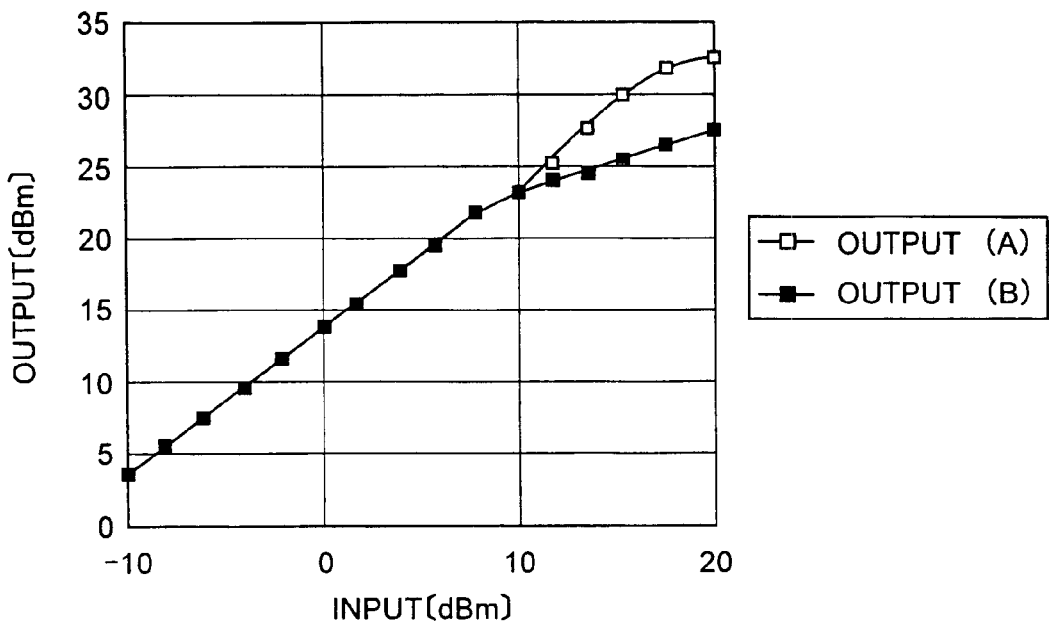
FIG. 3 is a diagram that shows relations between input power and output power of a high-output amplifier according to the first embodiment of the invention and a first conventional high-output amplifier.
Figure 4:
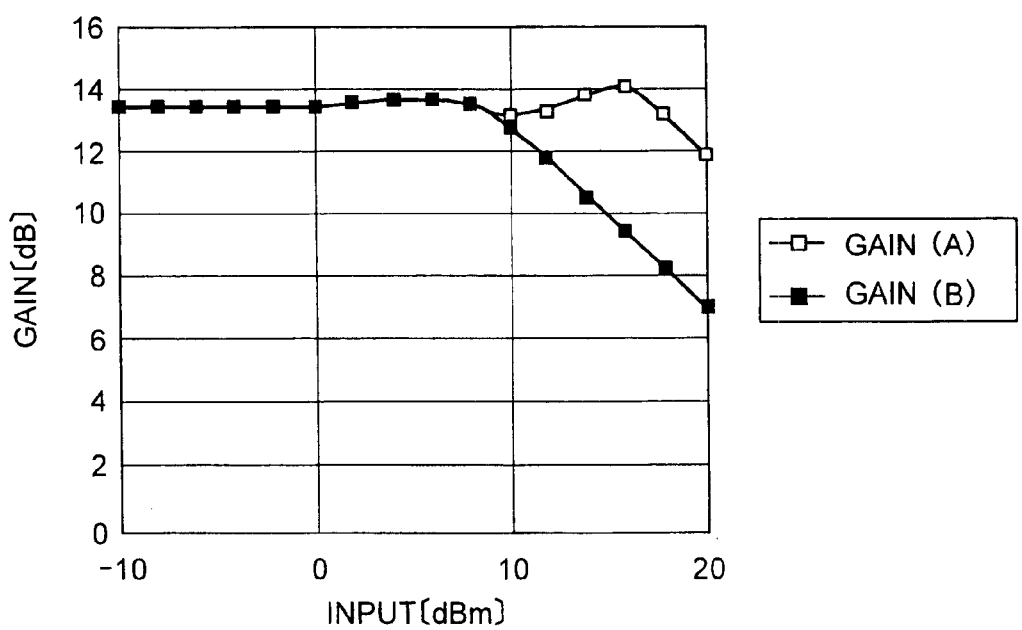
FIG. 4 is a diagram that shows relations between input powers and gains of a high-output amplifier according to the first embodiment of the invention and the first conventional high-output amplifier.
Figure 13:
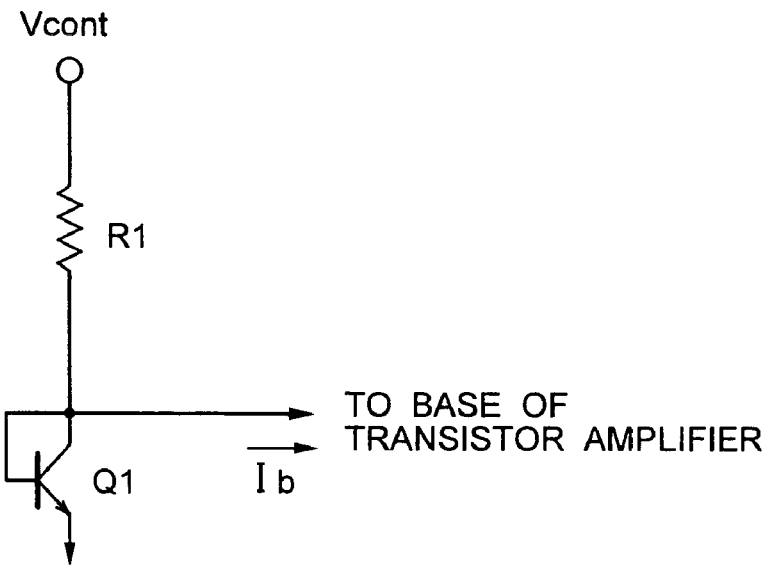
FIG. 13 is a diagram that shows a bias circuit arrangement of the first conventional high-output amplifier.

FIG. 3 is a diagram that shows output power characteristics relative to input powers in the band of 1.88 GHz in the high-output amplifier (FIG. 2 and FIG. 1) and the first conventional high-output amplifier (FIG. 13 and FIG. 1). Output (A) is the output power of the high-output amplifier according to the instant embodiment whereas output (B) is the output power of the conventional high-output amplifier. FIG. 4 is a diagram that shows changes in gain with output power. Gain (A) is the gain of the high-output amplifier according to the instant embodiment whereas gain (b) is the gain of the first conventional high-output amplifier. In the high-efficiency amplifier according to the instant embodiment, the output power and the gain increase up to the saturation region. In the conventional high-output amplifier, however, the gain rapidly decreases in the high-output region.

Figure 5:
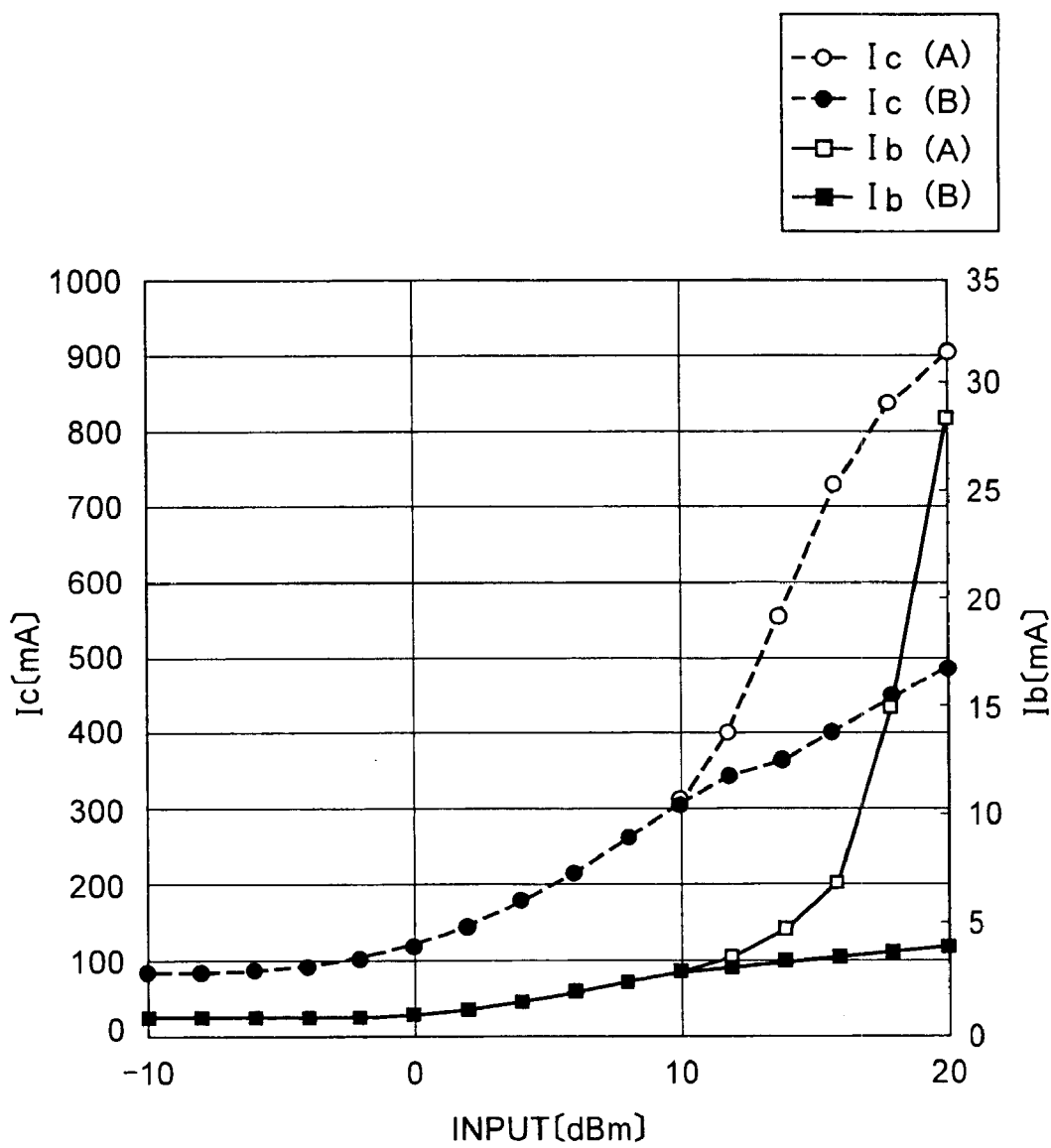
FIG. 5 is a diagram that shows relations between input powers and base currents Ib and relations between input powers and collector currents Ic of a high-output amplifier according to a transistor amplifier in the first embodiment of the invention and a transistor amplifier in the first conventional high-output amplifier.

FIG. 5 is a diagram that shows changes of the collector currents Ic with inputs and changes of the base currents Ib with inputs in the transistor amplifier RF1 of the high-output amplifier according to the instant embodiment and the transistor amplifier RF1 of the first conventional high-output amplifier. Ic(A) is the collector current of the transistor amplifier in the instant embodiment, Ic(B) is the collector current of the first conventional transistor amplifier, Ib(A) is the base current of the transistor amplifier in the instant embodiment, and Ib(B) is the base current of the first conventional transistor amplifier. In the transistor amplifier of the high-efficiency amplifier according to the instant embodiment, both the collector current Ic and the base current Ib increase with input. In the transistor amplifier of the conventional high-output amplifier, however, the increase slows down when the input reaches and exceeds 10 dB.

In this manner, the high-output amplifier according to the instant embodiment, when compared with the conventional circuit, has the property that it can operate linearly in output levels over a wide dynamic range even under the same control voltage. Its reason lies in that, in the bias circuit (FIG. 13) used in the conventional high-output amplifier, configured to supply the base current through R1, a voltage drop by R1 occurs when the input power increases, and becomes unable to supply a sufficient current, whereas, in the bias circuit used in the high-output amplifier according to the instant embodiment, when the input power increases, the transistor Q2 of the second bias circuit turns ON and a sufficient base current can be supplied to RF1 from Q2.

Next explained are characteristics of the bias circuit (FIG. 2) in the high-output amplifier according to the present embodiment, in comparison with the bias circuit (FIG. 13) of the conventional high-output amplifier.

Figure 6:
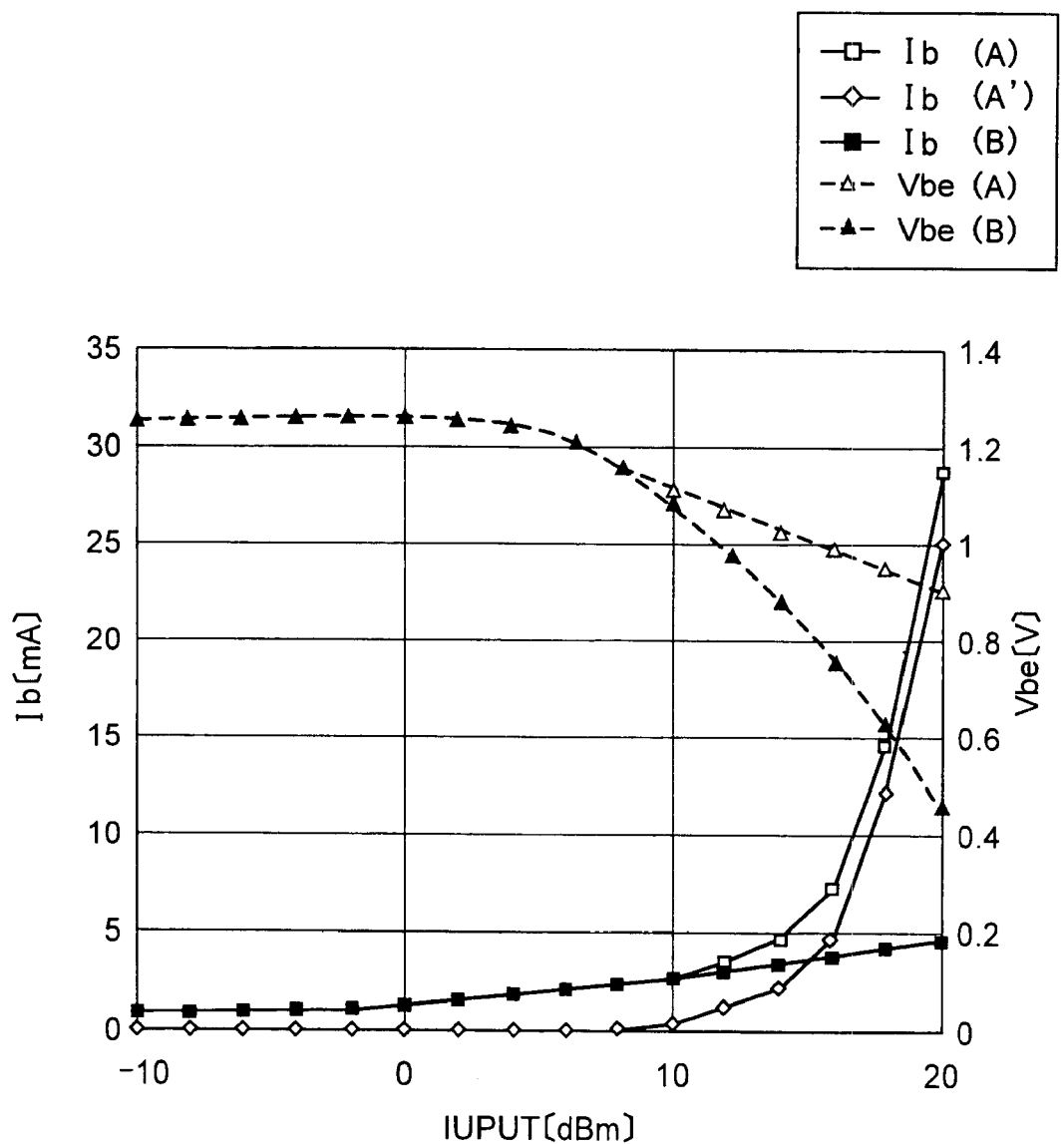
FIG. 6 is a diagram that shows characteristics of a bias circuit in a high-output amplifier according to the first embodiment of the invention and a bias circuit in the first conventional high-output amplifier, and in particular, relations between input powers and base currents Ib and relations between input powers and base/emitter voltage Vbe of transistors Q1.

FIG. 6 is a diagram that shows characteristics of the bias circuit in the high-output amplifier according to the first embodiment of the invention and the bias circuit in the conventional high-output amplifier. Chain lines in the drawing show relations between input powers from Pin (FIG. 1) and the base currents IB (FIGS. 1, 2 and 13), in which Ib(A) is Ib supplied from Q1 and Q2 of the bias circuit (FIG. 2), Ib(A') is Ib supplied from Q2 of the bias circuit in the instant embodiment, and Ib(B) is Ib supplied from Q1 of the bias circuit in the first conventional circuit. Broken lines in the drawing show input powers from Pin (FIG. 1) and base/emitter voltages of transistors Q1 (Figs, FIG. 13), in which Vbe(A) is Vbe of the bias circuit in the instant embodiment, and Vbe(B) is Vbe of the bias circuit in the first conventional circuit.

In the bias circuit used in the first conventional example, as the input power increases, the drop voltage by R1 becomes large, and the base/emitter voltage Vbe of Q1 decreases too low to sufficiently supply the base current Ib. In contrast, in the bias circuit in the instant embodiment, even when the input power increases, the base/emitter voltage Vbe of Q1 decreases by about 0.2V, and when the voltage drop by R1 becomes and exceeds approximately 1.2V, the emitter follower Q2 turns ON. Therefore, the base current Ib can be supplied sufficiently.

As reviewed above, in the high-output amplifier according to the instant embodiment, regardless of the control voltage as low as 2.2V, linear operation in output levels over a wider dynamic range is ensured.

(Second Embodiment)

The high-output amplifier according to the second embodiment is different from the first embodiment in grounding the base of the transistor Q2 of the second bias circuit in the bias circuit, and it is usable with a high control voltage.

Figure 7:
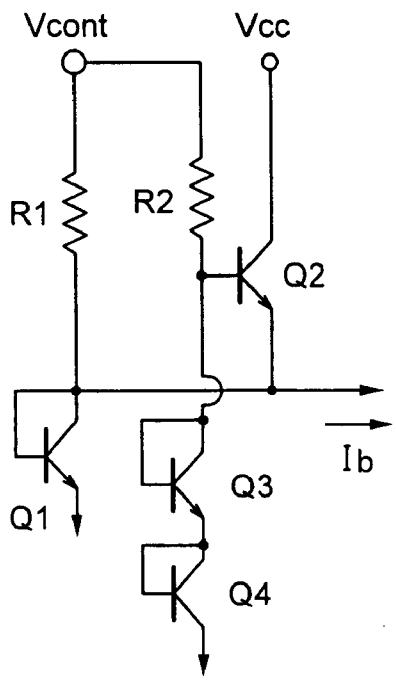
FIGS. 7 and 7A are diagrams that show different arrangements of bias circuits in high-output amplifiers according to the second embodiment of the invention.
Figure 7A:
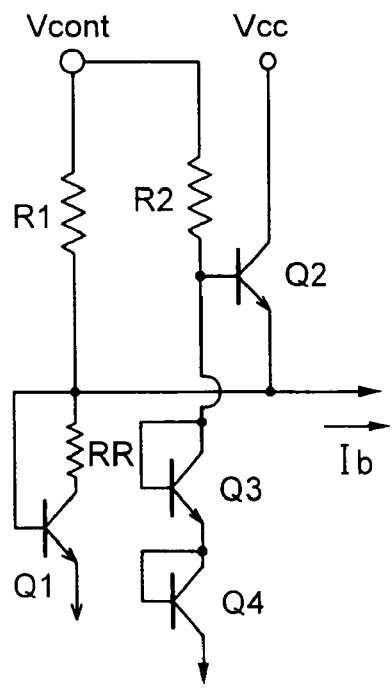

FIG. 7 is a diagram related to the high-output amplifier according to the second embodiment of the invention, and shows an arrangement of the bias circuit in the high-output amplifier.

In the bias circuit (FIG. 7) in the high-output amplifier according to the instant embodiment, the base of the transistor Q2 is connected to the control voltage Vcont via the resistor R2, and the base and the collector are short-circuited and grounded through diode-connected transistors Q3 and Q4. Q3 and Q4 function as a diode. In the other respects, the second embodiment is the same as the first embodiment (FIG. 2). The instant embodiment uses HBT's having an ON voltage of about 1.2V as Q3 and Q4; however, it may use a diode having an ON voltage of about 1.2V instead of each HBT.

The high-output amplifier according to the instant embodiment can be used with a high control voltage. That is, when the control voltage reaches or exceeds approximate 2.4 V, which is twice as large as the ON voltage Vbe of the transistor, the bias circuit in the first embodiment cannot prevent sudden supply of the base current because Q2 turn ON when it is biased. In the instant embodiment, however, which grounds the base with the diode-connected transistor or a diode, the voltage is limited to enable the use of the amplifier even with a high control voltage Vcont.

The circuit arrangement of the high-output amplifier according to the instant embodiment is the same as the first embodiment (FIG. 1) except that the circuit of FIG. 7 is used as the bias circuit instead of the circuit of FIG. 2.

Figure 14:
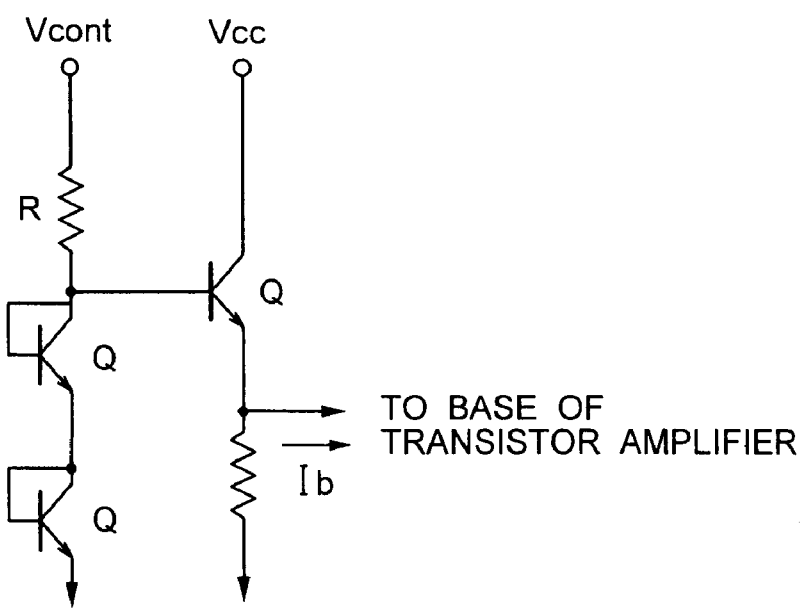
FIG. 14 is a bias circuit arrangement of the second conventional high-output amplifier.

Next explained are characteristics of the high-output amplifier according to the instant embodiment, in comparison with those of a conventional high-output amplifier. The high-output amplifier used as the comparative example is the second conventional high-output amplifier using the circuit of FIG. 14 as its bias circuit. This high-output amplifier involves the problem that it will be affected seriously by temperature changes unless the operation voltage is high, as already discussed above. The control voltage of the bias circuit is 2.7V both in the instant embodiment and in the conventional example. Although the high-output amplifier shown here is also usable with a control voltage of the bias circuit around 2.2V similarly to the first embodiment, the control voltage of 2.7V is used here to make the same condition as that of the comparative example.

Figure 8:
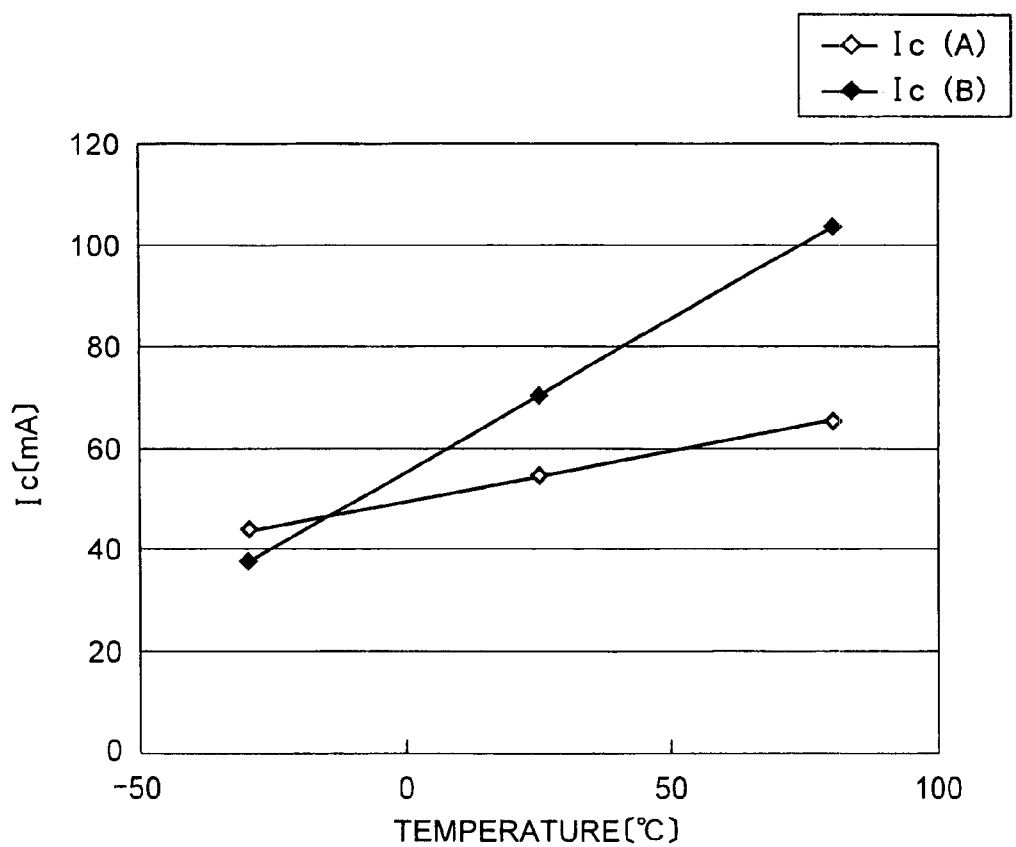
FIG. 8 is a diagram that shows characteristics of a high-output amplifier according to the second embodiment of the invention and a second conventional high-output amplifier, and in particular, relations between temperatures and collector currents Ic of transistor amplifiers.
Figure 9:
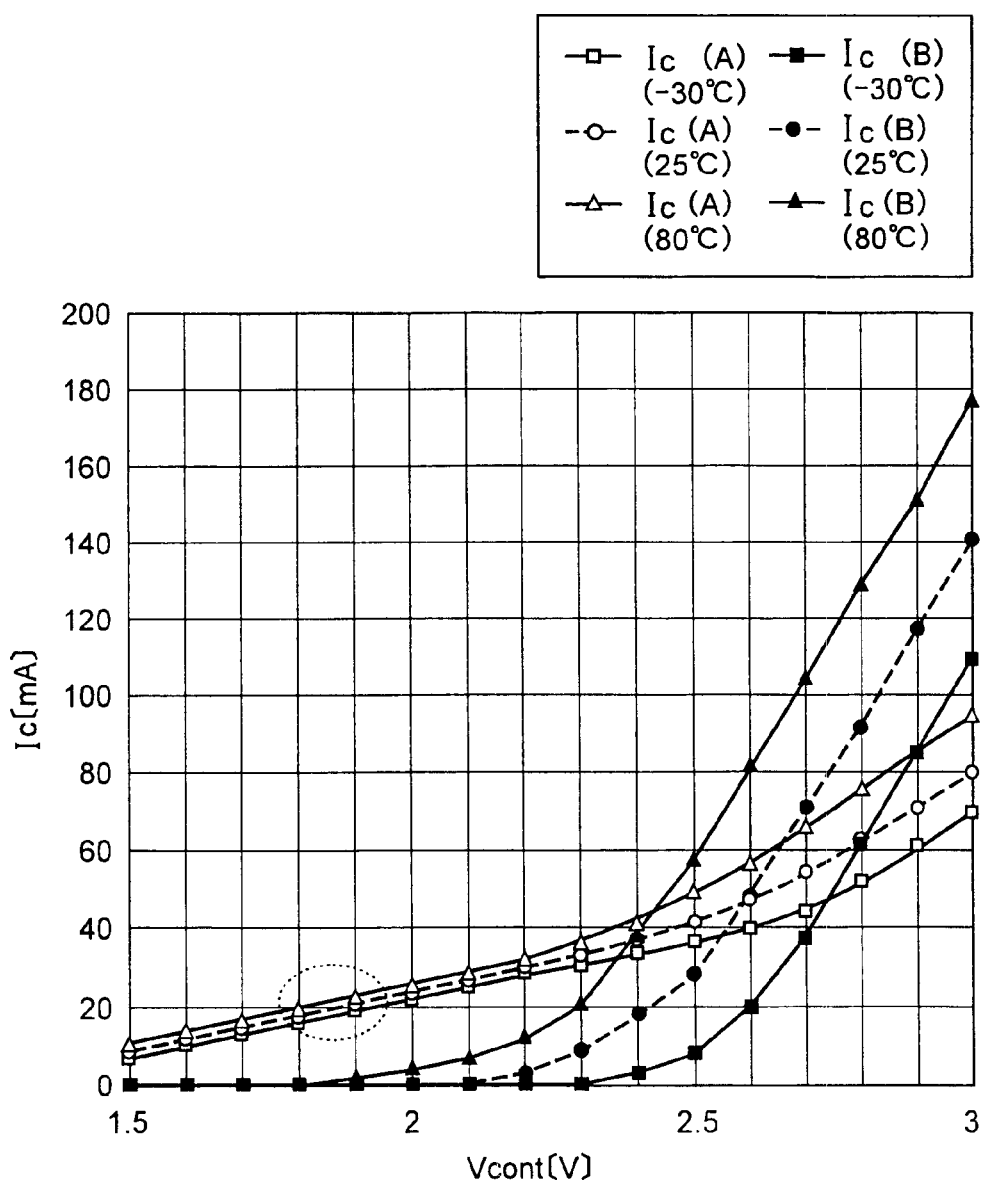
FIG. 9 is a diagram that shows characteristics of a high-output amplifier according to the second embodiment of the invention and the second conventional high-output amplifier, and in particular, relations between control voltages Vcont of their bias circuits and collector currents Ic of their transistor amplifiers under temperatures of −30° C., 25° C. and 80° C.

FIG. 8 is a diagram that shows changes of the collector currents Ic of transistor amplifiers in the high-output amplifier according to the instant embodiment and the second conventional high-output amplifier (see FIG. 1) when the control voltage of their bias circuits is Vcont=2.7V (FIG. 7, FIG. 14) and the temperature is changed to −30° C., 25° C. and 80° C. FIG. 9 is a diagram that shows relations between the control voltage Vcont of the bias circuits and the collector current Ic of the transistor amplifiers in the high-output amplifier according to the instant embodiment and the second conventional high-output amplifier (see FIG. 1) when the temperature is changed to −30° C., 25° C. and 80° C.

As shown in FIG. 8, in the conventional high-output amplifier, the collector current Ic of the transistor amplifier varies largely with temperature changes. Its reason lies in that, in the bias circuit (FIG. 14) in the conventional high-output amplifier, since variation of the bias current I relative to temperature T is substantially determined by $(T+\Delta T)/I(T)=(Vcont-2\times Vbe(T+\Delta T))/(Vcont-2\times Vbe(T))$, Vbe of HBT is about 1.2V at the room temperature (25° C.), which results in a voltage of only approximately 0.3V being available for temperature compensation under Vcont=2.6V, and variation of the current with temperature changes becomes large. Large variation of the bias current with temperature changes also invites large variation of the collector current Ic of the transistor amplifier with temperature changes.

On the other hand, as shown in FIG. 8, in the high-output amplifier according to the instant embodiment, variation of the collector current Ic of the transistor amplifier with temperature changes is small. Its reason is explained below with reference to FIG. 9. In the bias circuit of the high-output amplifier according to the instant embodiment, the current component variable with temperature changes is only the current flowing from Q2 of the second bias circuit, and the current component flowing from Q1 of the first bias circuit is not almost affected by temperature changes. As variation of the bias current with temperature becomes smaller, variation of the collector current Ic of the transistor amplifier with temperature also becomes smaller. In the high-output amplifier according to the instant embodiment, the collector current Ic of the transistor amplifier can be forcibly raised by the first bias circuit as the encircled section of the broken line in FIG. 9. Therefore, this current component is less likely to be affected by temperature changes, and current variation of the collector current Ic of the transistor amplifier with temperature can be prevented or minimized as shown in FIG. 8.

In this manner, the high-output amplifier according to the second embodiment ca not only operate linearly in output levels over a wide dynamic range but also minimize influences from temperature changes.

In addition, as shown in FIG. 9, in the conventional high-output amplifier (FIG. 14), the bias circuit does not operate with a control voltage of or below approximately 2.4V at the room temperature. The high-output amplifier according to the present embodiment (FIG. 7, FIG. 1) can be used even with a low control voltage.

Furthermore, in addition to the usability with a low control voltage similarly to the first embodiment, the high-output amplifier according to the second embodiment can be used with a high control voltage, if necessary, and even when the control voltage rises due to deterioration or other like reason, it is operative normally and hence practically advantageous.

(Third Embodiment)

The high-output amplifier according to the third embodiment is different from the first embodiment in comprising a transistor Q3 in the bias circuit, and it can be used also with a high control voltage similarly to the second embodiment.

Figure 10:
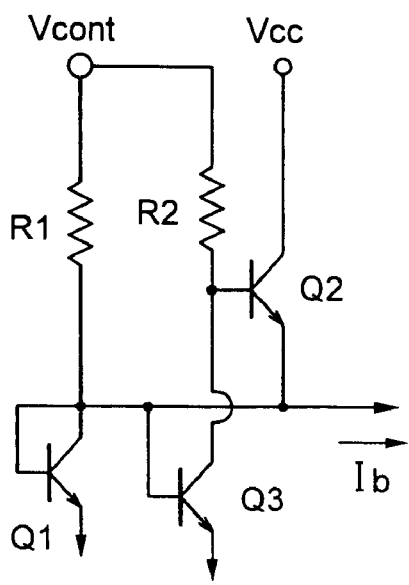
FIGS. 10 and 10A are diagrams that show different bias circuit arrangements of high-output amplifiers according to the third embodiment of the invention.
Figure 10A:
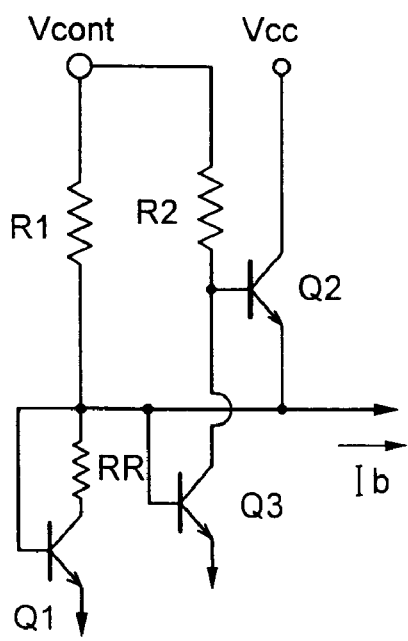

FIG. 10 is a diagram related to the high-output amplifier according to the third embodiment of the invention, and it shows a bias circuit in the high-output amplifier.

In the bias circuit according to the instant embodiment (FIG. 10), the second bias circuit further additionally comprises the transistor Q3. In Q3, the collector is connected to the base of the transistor Q2, the base is connected to the base and the collector of the transistor Q1, and the emitter is grounded. In the other respects, the third embodiment is the same as the first embodiment (FIG. 2).

Circuit arrangement of the high-output amplifier according to the instant embodiment is the same as that of the first embodiment (FIG. 1) except that the circuit of FIG. 10 is used as the bias circuit instead of the circuit of FIG. 2.

Similarly to the second embodiment, the high-output amplifier according to the third embodiment is usable with a high control voltage. That is, the bias circuit (FIG. 2) in the first embodiment, under a control voltage of or exceeding twice (−2.4V) as large as the base/emitter ON voltage of Q1, Q2 turns ON when it is biased, and the base current is suddenly supplied. In the bias circuit according to the third embodiment (FIG. 10), however, since the current of Q2 can be limited by flowing a current in Q3, it can be used even when the control voltage Vcont is high.

(Fourth Embodiment)

The high-output amplifier according to the fourth embodiment uses two-stage transistor amplifiers. Basic structure of the bias circuit is the same as that of the first embodiment.

Figure 11:
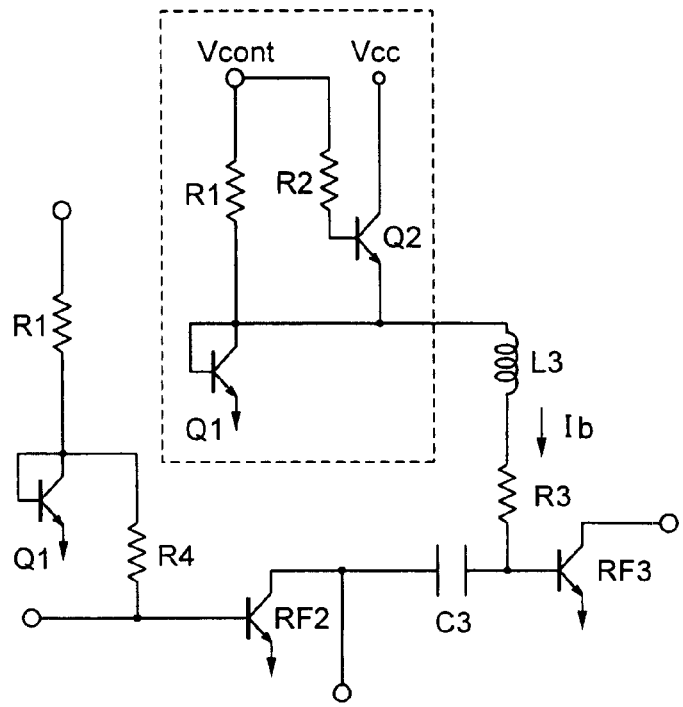
FIGS. 11 and 11A are diagrams that show different circuit arrangements of high-output amplifiers according to the fourth embodiment of the invention.
Figure 11A:
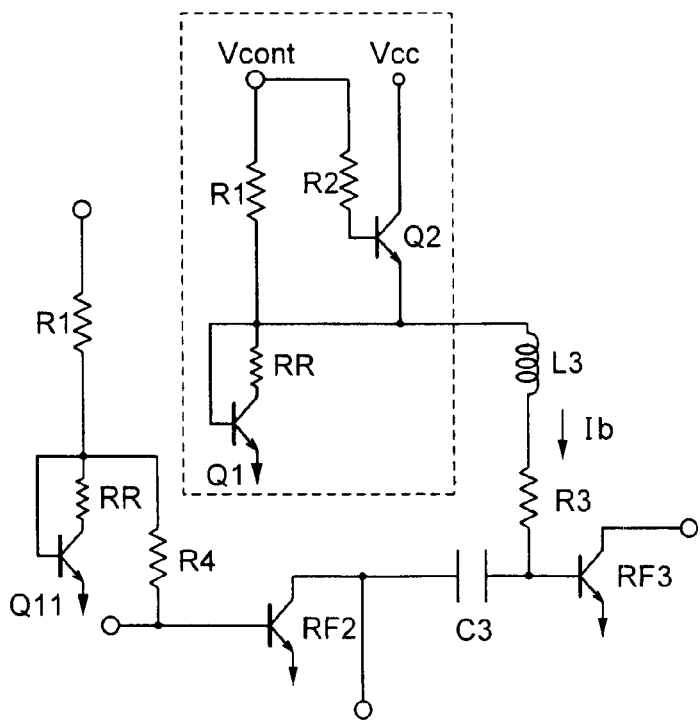

FIG. 11 is a diagram related to the high-output amplifier according to the fourth embodiment of the invention, and shows a circuit arrangement of the high-output amplifier. The transistor amplifier is made up of two-stage transistor amplifiers, namely, former-stage one RF2 and latter-stage one RF3. The bias circuit takes a class AB bias mode to the latter-stage transistor amplifier RF3 for the purpose of realizing a high efficiency. The bias circuit of RF3 is the same as that of the first embodiment. L3 is an inductance, C3 is a capacitor, and R3 and R4 are resistors.

In case transistor amplifiers in a plurality of stages are used, it is important to control the bias current of the final-stage transistor amplifier. That is, when a plurality of stages of transistor amplifiers are used, by controlling the base potential of the final-stage transistor amplifier by a method as explained with the first to third embodiments, for example, it is possible to ensure linear operation in output levels over a wide dynamic range while maintaining the control voltage low and to minimize influences from temperature changes.

The high-output amplifier according to the instant embodiment, which uses two-stage transistor amplifiers RF2 and RF3 and controls the base voltage/current of the latter-stage transistor amplifier RF3 with the method of the first embodiment, can operate linearly in output levels over a wide dynamic range regardless of the control voltage as low as 2.2V approximately and can be less affected by temperature changes.

(Fifth Embodiment)

The high-output amplifier according to the fifth embodiment is different from that first embodiment in using FET as a transistor of the second bias circuit in the bias circuit, and can be lowered in operation voltage.

Figure 12:
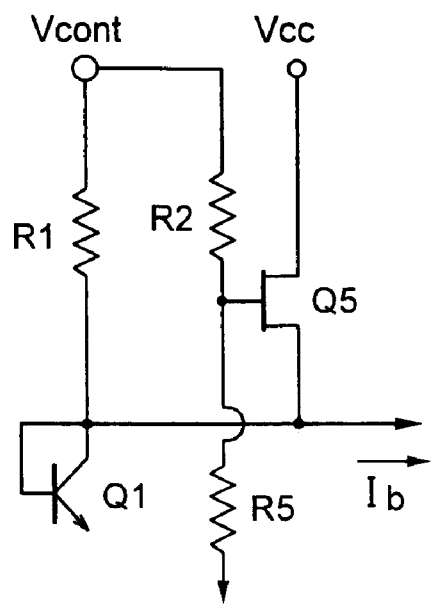
FIGS. 12 and 12A are different bias circuit arrangements of high-output amplifiers according to the fifth embodiment of the invention.
Figure 12A:
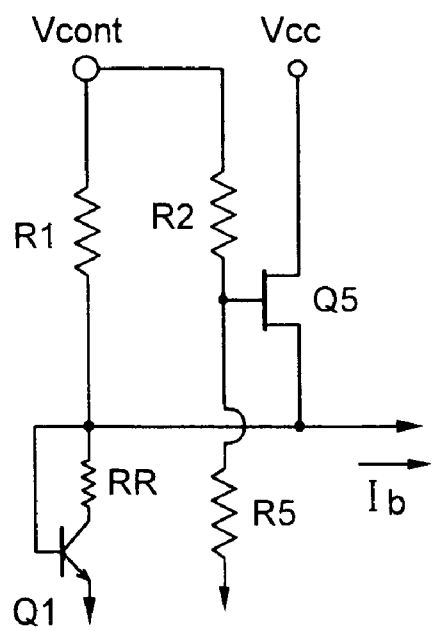

FIG. 12 is a diagram related to the high-output amplifier according to the fifth embodiment of the invention, and shows a bias circuit in the high-output amplifier.

The bias circuit (FIG. 12) in the high-output amplifier according to the fifth embodiment uses FET as the transistor Q5 of the second bias circuit. FET may be Si MOSFET or GaAs MOSFET. The gate of FET is connected to the control voltage Vcont=2.0V via the resistor R2 and also grounded via a resistor R5 whereas the drain is connected to the source terminal Vcc=3.4V. Its source is connected to the base and the collector of the transistor Q1 to form a source follower.

Circuit arrangement of the high-output amplifier according to the instant embodiment is the same as that of the first embodiment (FIG. 1) except that the circuit of FIG. 12 is used as the bias circuit instead of the circuit of FIG. 2.

In the fifth embodiment, the gate bias is determined by R2 and R5. Although the fifth embodiment is the same as the first embodiment in basic operation and effect, it enables further lowering the voltage by selecting a threshold value of FET.

According to high-output amplifiers according to embodiments of the invention, since each comprises a transistor amplifier, a bias circuit including first and second bias circuits to supply a bias to the control terminal of the transistor from the first bias circuit less affected by temperature changes when the transistor is used with a small signal (idling current) and to supply a bias from the second bias circuit capable of supplying a large base current when the transistor is used with a large signal, it is possible to provide a high-output amplifier linearly operate in output levels over a wide dynamic range, using a low control voltage, and less affected by temperature changes.

What is claimed is:

1. A high-output amplifier, comprising:
   a bias circuit having a first bias circuit and a second bias circuit, said first bias circuit including a first transistor having one end connected to a first high-voltage-side source and the other end connected to a low-voltage-side source, said one end being connected to the control terminal of the first transistor, said second bias circuit including a second transistor having one end connected to a second high-voltage-side source, the other end connected to said one end of said first transistor, and a control terminal connected to said first high-voltage-side source; and
   a transistor amplifier having a control terminal connected to said one end of said first transistor, one end as an output terminal of said high-output amplifier, and the other end connected to the low-voltage-side source, wherein
   said one end of said first transistor is connected to a control terminal of said transistor amplifier via an LC component.

2. An amplifier according to claim 1 wherein a first resistor is connected between said control terminal of said first transistor and said first high-voltage-side source, and said control terminal of said second transistor is connected via a second resistor to said first high-voltage-side source.

3. An amplifier according to claim 2 wherein a resistor RR is connected between said control terminal and said one end of said first transistor.

4. An amplifier according to claim 1 wherein said transistor amplifier, said first transistor and said second transistor are compound bipolar transistors.

5. An amplifier according to claim 1 wherein matching circuits are connected, respectively, between an input end of said high-output amplifier and a control terminal of said transistor amplifier, and between said one end of said transistor amplifier and said output terminal of said high-output amplifier.

6. An amplifier according to claim 1 wherein said one end of said transistor amplifier is connected to a third high-voltage-side source through an LC component.

7. An amplifier according to claim 6 wherein said first transistor and said transistor amplifier have emitters grounded, and said second transistor is configured as an emitter follower.

8. An amplifier according to claim 1 wherein said control terminal of said second transistor is grounded to the low-voltage-side source via a resistor component.

9. An amplifier according to claim 8 wherein said resistor component is diode-coupled transistors.

10. An amplifier according to claim 8 wherein said resistor component is a transistor having a control terminal connected to said one end of said first transistor.

11. An amplifier according to claim 1 wherein the control terminal of said transistor amplifier is connected to a preamplifying transistor.

12. An amplifier according to claim 11 wherein said preamplifying transistor has a control terminal to which one end of a third transistor connected between a high-voltage-side source and a low-voltage-side source is connected.

13. An amplifier according to claim 12 wherein said third transistor is in diode connection.

14. An amplifier according to claim 12 wherein said third transistor is connected between said high-voltage-side source and said low-voltage-side source via resistors.

15. An amplifier according to claim 1 wherein said second transistor is a MOS transistor.

16. An amplifier according to claim 1 wherein said first high-voltage-side source is not larger than twice as large as a base/emitter ON voltage of said first transistor which is bipolar transistor.

* * * * *